United States Patent
Boivin et al.

(10) Patent No.: US 10,482,957 B2
(45) Date of Patent: Nov. 19, 2019

(54) RESISTIVE RAM MEMORY CELL

(71) Applicant: STMICROELECTRONICS (ROUSSET) SAS, Rousset (FR)

(72) Inventors: Philippe Boivin, Venelles (FR); Simon Jeannot, Grenoble (FR); Olivier Weber, Grenoble (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 15/978,003

(22) Filed: May 11, 2018

(65) Prior Publication Data

US 2018/0330780 A1 Nov. 15, 2018

(30) Foreign Application Priority Data

May 12, 2017 (FR) ...................... 17 54198

(51) Int. Cl.
*G11C 13/00* (2006.01)
*H01L 45/00* (2006.01)

(52) U.S. Cl.
CPC ........ *G11C 13/003* (2013.01); *G11C 13/0002* (2013.01); *G11C 13/0007* (2013.01); *G11C 13/0023* (2013.01); *H01L 45/122* (2013.01); *H01L 45/124* (2013.01); *H01L 45/145* (2013.01); *H01L 45/146* (2013.01); *G11C 2213/79* (2013.01)

(58) Field of Classification Search
CPC .. H01L 45/124; H01L 45/146; H01L 45/1206
See application file for complete search history.

(56) References Cited

U.S. PATENT DOCUMENTS

| 8,471,233 | B2* | 6/2013 | Aozasa | H01L 27/101 257/2 |
| 8,698,118 | B2* | 4/2014 | Toh | H01L 45/04 257/2 |
| 9,735,353 | B2* | 8/2017 | Boivin | H01L 45/06 |
| 9,793,321 | B2* | 10/2017 | Boivin | H01L 27/2436 |
| 2008/0259672 | A1 | 10/2008 | Lung | |
| 2016/0380030 | A1 | 12/2016 | Boivin et al. | |

FOREIGN PATENT DOCUMENTS

JP 09082912 A 3/1997

* cited by examiner

*Primary Examiner* — Allison Bernstein
(74) *Attorney, Agent, or Firm* — Seed Intellectual Property Law Group LLP

(57) ABSTRACT

The disclosure relates to a memory cell comprising a resistive RAM memory element and a selection transistor, in which the memory element is positioned on a flank of the selection transistor.

18 Claims, 3 Drawing Sheets

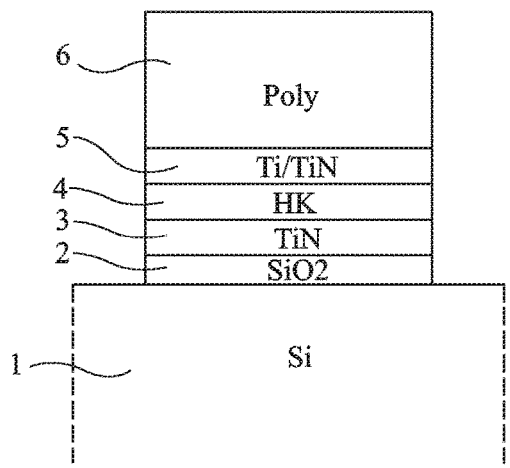
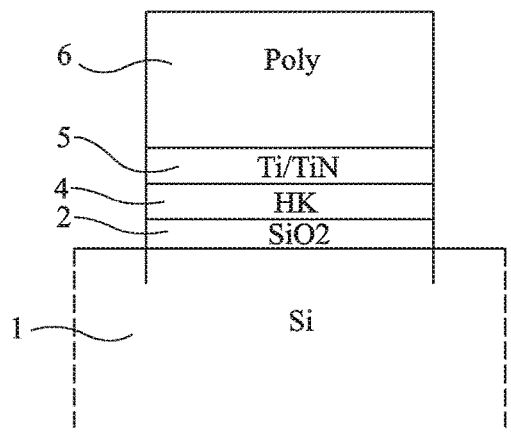
*FIG. 1A*
*(Prior Art)*
*FIG. 1B*
*(Prior Art)*
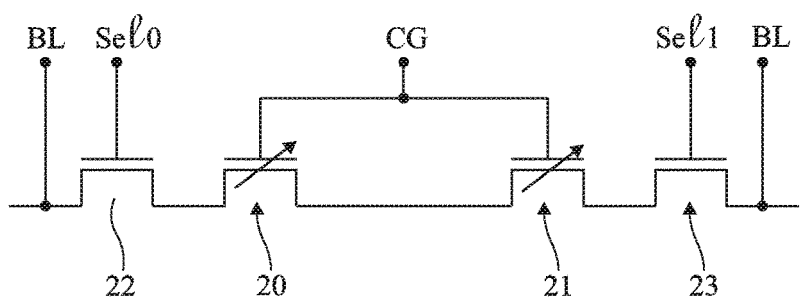
*FIG. 2*
*(Prior Art)*

RESISTIVE RAM MEMORY CELL

BACKGROUND

Technical Field

The present application relates to memory cells using OxRAM memory elements.

Description of the Related Art

Among the various types of erasable and rewritable memory elements of resistive RAM type, i.e., where the resistance takes one or the other of two values depending on the state thereof, oxide RAM, or OxRAM, structures have been developed. In a very general manner, these OxRAM cells comprise a metal oxide, for example $HfO_2$, surrounded by conductive structures. Among these conductive structures, one thereof is for example made of an oxidizable metal such as Ti or Hf, optionally coated with a protective conductive material such as TiN, and the other is for example composed of a metal compound such as TiN or potentially silicon. Thus, it may be noted that the structures of these OxRAM memory elements are very similar to MOS transistor gate structures, in which the dielectric forming the gate insulator is a dielectric exhibiting high permittivity (high-k dielectric), for example $HfO_2$ or $Ta_2O_5$.

FIGS. 1A and 1B show an exemplary conventional OxRAM memory element structure and an exemplary conventional MOS transistor gate structure, respectively.

The exemplary OxRAM structure of FIG. 1A comprises, on a silicon layer or substrate 1, a layer of native oxide, that is to say a very thin layer of silicon oxide 2, a layer of TiN 3, a layer of material exhibiting high permittivity (HK) 4, a layer of Ti/TiN 5 and a contact layer 6, for example made of doped polycrystalline silicon.

Although the phenomena involved in the programming of such an OxRAM structure are poorly understood, it may be assumed, without limiting the scope of the present description, that these phenomena are the following in the case of the memory element of FIG. 1A, where the first electrode corresponds to the TiN layer 3 and the second electrode corresponds to the Ti/TiN layer 5. It starts with an initial state in which the layer of material exhibiting high permittivity, or high-k material, is highly resistive. A first application of a relatively high voltage between the conductive layers surrounding the structure leads to a localized change in the layer 4 of material exhibiting high permittivity. It is assumed that, during the application of the voltage, oxygen present in the high-k layer 4 migrates towards the titanium layer. This results in the conductivity of the Ti/TiN layer being practically unaffected but the conductivity of the high-k layer 4, the degree of oxidation of which has decreased, being greatly increased. By subsequently applying voltages, for example in the opposite direction to the terminals of the structure, the memory element is returned to a high resistivity state, and a state of lower resistivity is regained by again reapplying a voltage in the opposite direction. It should be noted that in the literature, it is also proposed to apply voltages of the same polarity in order to achieve the transition to high resistivity and the transition to lower resistivity, pulses of different voltage being applied, for example one of the voltages being applied with current limitation. In the event of a thin layer of silicon oxide (native oxide) being present in addition to the layer of material exhibiting high permittivity, the first application of a relatively high voltage would lead to a breakdown which would cause a long-lasting local conduction effect in said thin layer of silicon oxide.

FIG. 1B shows an exemplary MOS transistor gate structure in which the gate insulator is a material exhibiting high permittivity (high-k material). The successive layers 1 of silicon (the substrate), a layer of native oxide 2, the layer of material exhibiting high permittivity 4, a layer of Ti/TiN 5 and a layer of polycrystalline silicon 6 may be seen. The layer of TiN 3 is absent.

It may therefore be seen that, at least in some cases, an OxRAM memory element and a MOS transistor gate can be produced using stacks of very similar layers and hence that such memory elements lend themselves to integration in accordance with existing CMOS technologies.

FIG. 2 shows two adjacent memory elements in a matrix of memory cells. Each memory element 20, 21 is associated with one selection transistor 22, 23. The two memory elements 20, 21 share, for example, a common control gate CG. The selection transistors 22 and 23 are controlled by gate signals Sel0 and Sel1, respectively. The terminal of the selection transistors that is not connected to a memory element is connected to a common line; for example, in a matrix of cells, to a bit line BL. In order to program a memory element, the associated selection transistor is selected and a voltage that is higher or lower than that of the bit line BL is applied to the control gate CG. A higher voltage forms a conductive filament between the conductive regions, thereby biasing the source of the selection transistor at the gate potential CG. A lower voltage breaks down a conductive filament between the conductive regions, thereby insulating the source of the selection transistor from the gate potential CG. In addition, the selection transistors may be controlled so as to limit the current passing therethrough during one or the other of the programming phases. The source potential will therefore modify the current flowing through the selected transistor.

The present application aims to produce a memory cell using a selection transistor and an OxRAM memory element of minimal size.

BRIEF SUMMARY

Thus, one embodiment makes provision for a memory cell comprising a resistive RAM memory element and a selection transistor, in which the memory element is positioned on a flank of the selection transistor.

According to one embodiment, the memory element rests at least partially on a conductive zone which also constitutes the drain or the source of the selection transistor.

According to one embodiment, the constituent layers of the memory element extend partially over the selection transistor.

According to one embodiment, the constituent layers of the memory element extend in the form of successive spacers over a flank of the selection transistor.

According to one embodiment, the memory element is of OxRAM type.

According to one embodiment, the memory element and the transistor consist of stacks of the same materials.

According to one embodiment, the memory element comprises, on said conductive zone, a layer of a metal oxide chosen from the group comprising $HfO_2$ and $Ta_2O_5$ and a layer of an oxidizable metal chosen from the group comprising titanium and hafnium.

According to one embodiment, the conductive zone is made of titanium nitride.

According to one embodiment, a pair of memory cells consists of two memory cells such as described above, the two memory elements being located side by side and the selection transistors being positioned outside the memory elements.

According to one embodiment, the pair of memory cells is produced using SOI technology.

According to one embodiment, the pair of memory cells comprises insulation between each of the memory cells.

BRIEF DESCRIPTION OF THE SEVERAL VIEWS OF THE DRAWINGS

These features and advantages, along with others, will be presented in detail in the following description of particular embodiments, provided without limitation and in relation to the appended figures among which:

FIGS. 1A and 1B, described above, show examples of an OxRAM memory element and a MOS transistor gate with a dielectric exhibiting high permittivity;

FIG. 2, described above, shows, in the form of a circuit, two neighboring cells of a memory matrix;

DETAILED DESCRIPTION

It will be noted that, in order to enhance the legibility of the figures, the various views in cross section of stacks of layers are not shown to scale, both within a given figure and from one figure to another. For the dimensions of the various layers, reference will be made to the general knowledge of a person skilled in the art and to the particular indications that may be given in the description below.

In the following description, when reference is made to qualifiers, such as the terms "in front of", "high", "above", etc., reference is being made to the orientation of the elements in question in the figures. Unless specified otherwise, the expression "of the order of" signifies to within 10%, preferably to within 5%.

Figure 3:
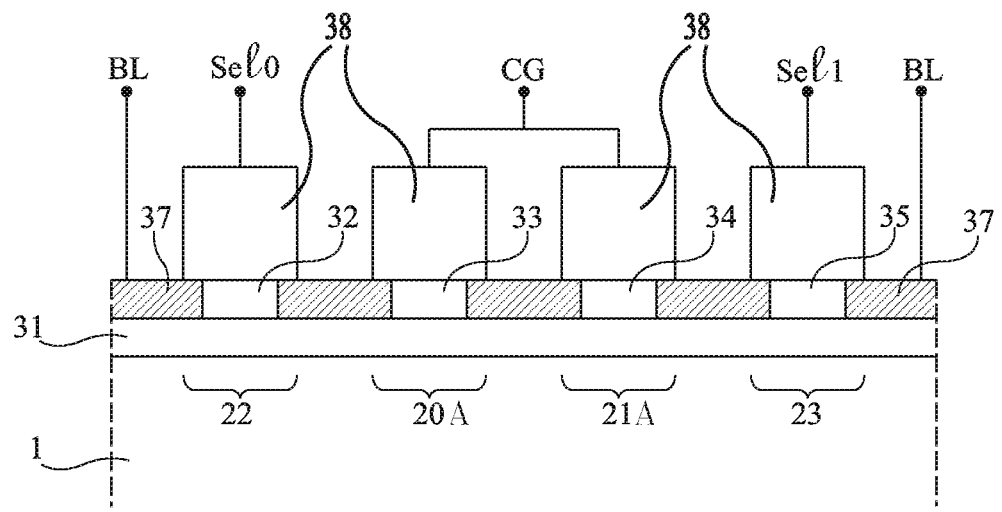
FIG. 3 shows one exemplary embodiment of the two memory cells of FIG. 2.

FIG. 3 shows a simple structure that may be made in order to implement the circuit illustrated in FIG. 2 by means of stacks of the type of those shown in FIGS. 1A and 1B. In this figure, the memory elements 20A and 21A are shown centrally and the selection transistors 22 and 23 are shown to the sides. The terminals of the various elements bear the same references as in FIG. 2. The structure is formed using silicon-on-insulator technology in which a carrier substrate 1, commonly made of silicon, is coated with a thin insulating layer 31, commonly known in the art by the acronym BOX, for buried oxide. On this buried layer, silicon islands 32, 33, 34, 35 remain in a layer of silicon. These silicon islands are channel regions of the respective selection transistors and memory elements and are separated by conductive zones 37 forming the source and drain regions of the respective selection transistors and memory elements. The transistors and the memory elements include insulated gate stacks 38 of the type described above on top of each silicon island. When it is desired to select one of the transistors, its control terminal Sel0 or Sel1 is activated and the near-intrinsic silicon 32 or 35 becomes conductive, establishing conduction between the conductive zones 37 that are positioned on either side of this transistor.

Regarding the memory elements 20A and 21A, their gate stacks 38 are respectively formed on top of the silicon islands 33 and 34, but go over the edges thereof such that the gate dielectrics of the gate stacks make contact with the conductive zones 37 positioned on either side of each of these memory elements. The stack of each of these memory elements is for example of the type of that shown in FIG. 1A. Thus, it is understood that, when a transistor is selected, depending on the voltage levels across the terminals CG and BL, each of the memory elements may be programmed to have a first state (high resistance) or a second state (low resistance).

This structure gives satisfactory results but its bulk is non-negligible. Specifically, using technology in which the minimum dimension for the lengths of the gate is of the order of 28 nm, the structure occupies a length of 9×28=252 nm for a width of 2×28=56 nm.

In this instance structures are sought to be produced which allow the area of each pair of memory cells to be minimized.

Figure 4:
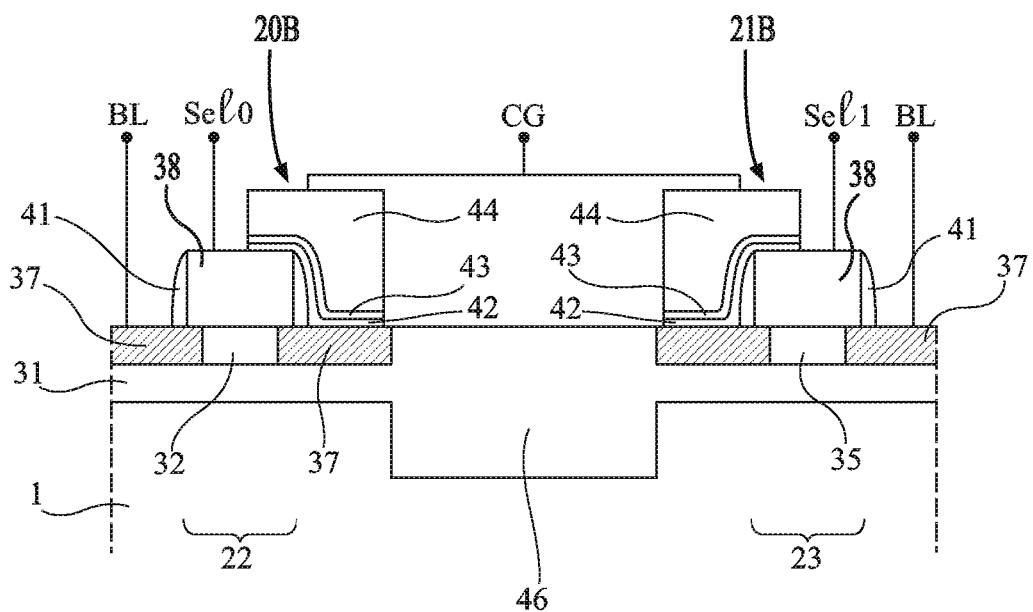
FIG. 4 shows one exemplary embodiment of two memory cells such as those of FIG. 2.

FIG. 4 illustrates a first embodiment of a pair of memory cells having the same function as the pair of memory cells of FIG. 3 and implementing the circuit of FIG. 2, but occupying a smaller area than the pair of memory cells of FIG. 3.

The two selection transistors 22 and 23 include the silicon islands 32 and 35 of an SOI structure as semiconductive channel regions and have respective insulated gates 38 formed on the silicon islands 32, 35. These insulated gates 38 of the two transistors may each comprise a gate stack of the type of that of FIG. 1B, or other gate stacks may be employed. The insulated gates 38 of these transistors 22, 23 are surrounded by insulating spacers 41, for example made of a silicon oxide or nitride. As in FIG. 3, the selection transistors 22, 23 also include as source/drain regions the conductive zones 37, for example made of titanium nitride.

The memory elements 20B and 21B are formed from layers deposited after the formation of the transistors 22, 23. In the example shown, the stack corresponding to each memory element 20B, 21B covers the conductive zone 37 and includes a layer of a metal oxide 42, such as $HfO_2$ or $Ta_2O_5$, covered with a layer of Ti/TiN 43, and with a contact layer of polycrystalline silicon 44. Once this assembly of layers has been formed, the memory elements are delimited by anisotropic etching such that each memory element is located beside and slightly on top of a flank of the insulated gate 38 of each transistor 22, 23.

An insulating region 46 has also been shown in the figure, which region reaches and generally goes beyond the insulating layer 31 in order to separate the two memory cells. This insulating region 46 is intended to prevent false information being supplied during the readout phases. This false information could result from a parasitic current flowing through the silicon islands.

Figure 5:
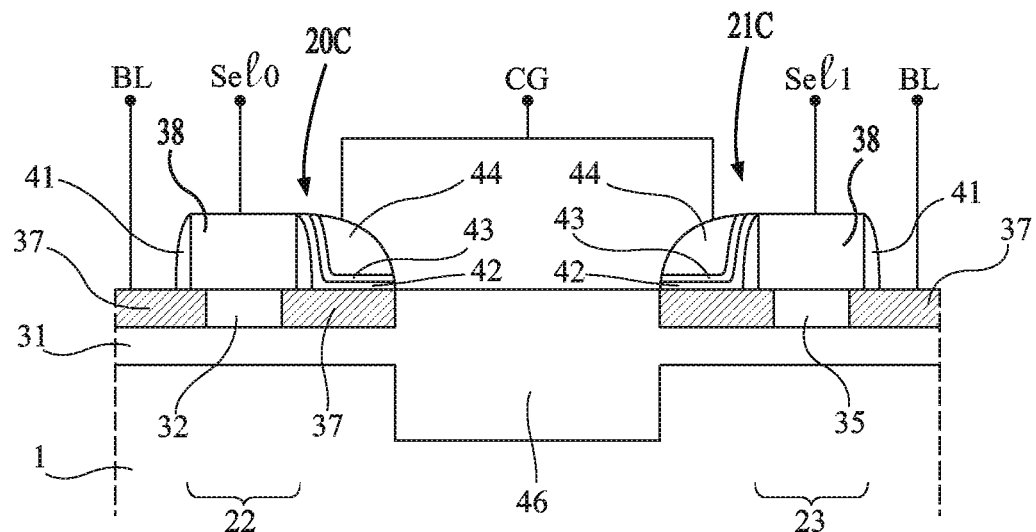
FIG. 5 shows a first variant of the memory cells of FIG. 4.
Figure 6:
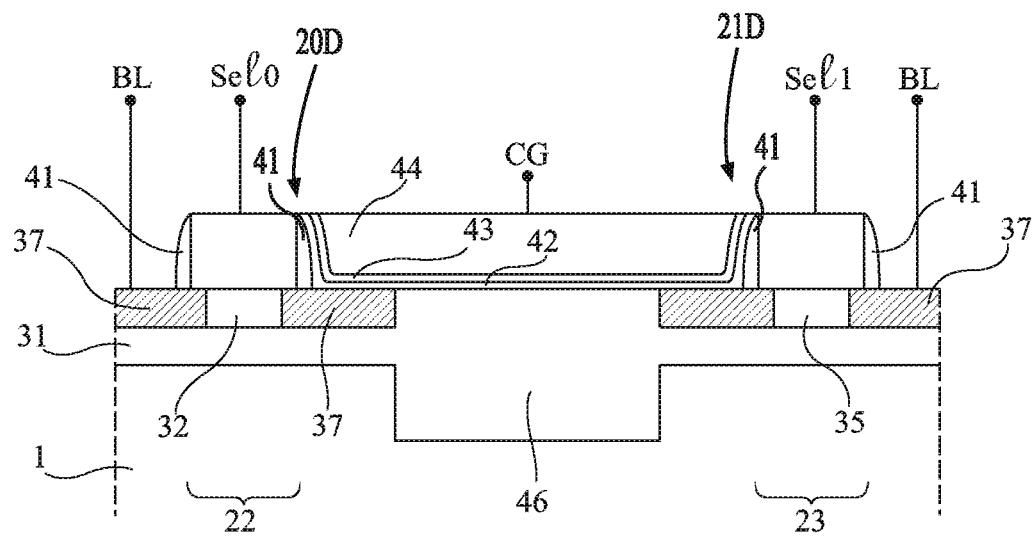
FIG. 6 shows a second variant of the memory cells of FIG. 4.

FIG. 5 shows a first variant of the structure of FIG. 4. It shows the same elements referenced by the same references as in FIG. 4. This time, as will be noted, the structure of the memory elements 20C, 21C is the result of a different mode of fabrication. A first spacer 41 made of an insulating material, for example silicon oxide or nitride, is formed around the gate of the selection transistors 22, 23. Layers of metal oxide 42 ($HfO_2$ or $Ta_2O_5$) and layers of a conductor 43 (Ti/TiN) are next formed like L-shaped spacers, and the contact layers of polycrystalline silicon 44 are spacers formed on the vertical and horizontal portions of the conductors 43. The memory elements 20C, 21C thereby are formed on the sidewalls of the gates 38 and on the conductive zones 37 of the selection trans without extending on the top surfaces of the gates 38. The steps of formation of generic spacers are well-known techniques in the field of integrated circuit fabrication, which allow the dimensions to be decreased with respect to the case of FIG. 4. The FIG. 6 shows a second variant. The structure is similar to that of FIG. 5. Each of the layers extends continuously between the transistors 22, 23. In particular, the layer 42 extends entirely from the spacer 41 on the sidewall of the gate 38 of the selection transistor 22 to the spacer 41 on the sidewall of the gate 38 of the selection transistor 23 and directly contacts the inner conductive zones 37 of the transistors 22, 23. The layer 43 coats the entire top surface of the layer 42 and the contact layer 44 extends completely from the sidewall of the layer 43 adjacent to the selection transistor 22 to the sidewall of the layer 43 adjacent to the selection transistor 23. As such, the portions of the layers 42-44 adjacent to the respective selection transistors 22, 23 constitutes the two memory elements 20D and 21D.

The contact layers 44 of the memory elements 20B-D, 21B-D of FIGS. 4-6 are connected together as a common control gate terminal CG. The selection transistors 22 and 23 are connected to respective gate signal terminals controlled by gate signals Sel0 and Sel1, respectively. The conduction zone 37 of the selection transistors that is not connected to one of the memory elements 20B-D, 21B-D is connected to a common line; for example, in a matrix of cells, to a bit line BL. In order to program one of the memory elements 20B-D, 21B-D, the associated selection transistor is selected using one of the selection signal Sel1, Sel2 and a voltage that is higher or lower than that of the bit line BL is applied to the control gate terminal CG. A higher voltage forms a conductive filament between the conductive zones 37, thereby biasing the source of the selection transistor at the gate potential CG. A lower voltage breaks down a conductive filament between the conductive zones, thereby insulating the source of the selection transistor from the gate potential CG. In addition, the selection transistors may be controlled so as to limit the current passing therethrough during one or the other of the programming phases. The source potential will therefore modify the current flowing through the selected transistor.

All of the embodiments and variants shown in FIGS. 4, 5 and 6 allow minimal dimensions to be obtained. For example, in the case of the structure of FIG. 6, if the length of the gate stack of each of the transistors is 28 nm, the distance between the transistors may be 60 nm using a technology in which the minimum gate dimensions are 28 nm. Therefore, for one and the same length of the order of 2×28=56 nm, a total length of the structure of 4×28+60=172 nm is achieved, instead of 252 nm in the case of the structure of FIG. 3. Of course, in the event of even more advanced technologies, the dimensions could be decreased still further.

The present disclosure is subject to numerous variants and modifications, in particular regarding the materials that may be used and the number of layers making up the gate stacks of the transistors and of the memory elements, the particular memory element structures indicated here having been given solely by way of example.

Although the present description has been provided within the context of OxRAM memory elements, it will be understood that it applies to any resistive RAM memory element.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A memory cell comprising:
   a selection transistor having a gate, source, and drain, at least one of the source and drain being a conductive zone formed in a substrate layer; and
   a resistive RAM memory element positioned along a sidewall of the gate of the selection transistor and directly contacting the conductive zone, in which the memory element rests at least partially on a top surface of the gate of the selection transistor.

2. The memory cell according to claim 1, in which the memory element includes L-shaped constituent layers having substantially vertical portions that extend along the sidewall of the gate and substantially horizontal portions that extend at least partially on the conductive zone of selection transistor.

3. The memory cell according to claim 2, in which the constituent layers of the memory element include a conductive contact spacer that extends on the L-shaped constituent layer and does not extend above a height of the gate.

4. The memory cell according to claim 1, in which the memory element is of OxRAM type.

5. The memory cell according to claim 1, in which the memory element and the transistor are formed on a silicon-on-insulator substrate.

6. The memory cell according to claim 1, in which the memory element comprises, on said conductive zone, a layer of a metal oxide chosen from the group consisting of $HfO_2$ and $Ta_2O_5$ and a layer of an oxidizable metal chosen from the group comprising consisting of titanium and hafnium.

7. The memory cell according to claim 1, in which said conductive zone is made of titanium nitride.

8. A memory, comprising:
   a substrate layer; and
   first and second memory cells each including:
      a selection transistor having a gate, source, and drain, at least one of the source and drain being a conductive zone formed in the substrate layer; and
      a resistive RAM memory element positioned along a sidewall of the gate of the selection transistor and directly contacting the conductive zone, in which the first and second memory elements are located side by side, wherein in each of the first and second memory cells, the memory element of the memory cell rests at least partially on a top surface of the gate of the selection transistor of the memory cell.

9. The memory according to claim 8, wherein the substrate layer is part of a silicon-on-insulator substrate.

10. The memory according to claim 9, comprising insulation between the conductive zone of the first memory cell and the conductive zone of the second memory cell.

11. The memory according to claim 8, wherein the memory element of the first memory cell includes a conductive first contact and the memory element of the second memory cell includes a conductive second contact that is spaced apart from, and electrically connected to, the first contact.

12. The memory according to claim 8, wherein the memory element of the first memory cell includes a conductive first contact and the memory element of the second memory cell includes a conductive second contact that is contiguous with the first contact.

13. The memory according to claim 8, wherein in each of the first and second memory cells, the memory element includes L-shaped constituent layers having substantially vertical portions that extend along the sidewall of the gate and substantially horizontal portions that extend at least partially on the conductive zone of the selection transistor of the memory cell.

14. The memory according to claim 13, wherein in each of the first and second memory cells, the constituent layers of the memory element include a conductive contact spacer that extends on the L-shaped constituent layer and does not extend above a height of the gate of the selection transistor of the memory cell.

15. The memory according to claim 8, wherein in each of the first and second memory cells, the memory element comprises, on said conductive zone, a layer of a metal oxide chosen from the group consisting of $HfO_2$ and $Ta_2O_5$ and a layer of an oxidizable metal chosen from the group consisting of titanium and hafnium.

16. A memory, comprising:
    a silicon on insulator substrate that includes a semiconductor layer on a buried insulating layer;
    first and second memory cells each including:
        a selection transistor having a gate, source, and drain, at least one of the source and drain being a conductive zone formed in the substrate layer; and
        a resistive RAM memory element positioned along a sidewall of the gate of the selection transistor and directly contacting the conductive zone, in which the first and second memory elements are located side by side; and
    an insulating region extending between the conductive zone of the first memory cell and the conductive zone of the second memory cell, the insulating region including a portion of the buried insulating layer.

17. The memory according to claim 16, wherein the memory element of the first memory cell includes a conductive first contact and the memory element of the second memory cell includes a conductive second contact that is spaced apart from, and electrically connected to, the first contact.

18. The memory according to claim 16, wherein the memory element of the first memory cell includes a conductive first contact and the memory element of the second memory cell includes a conductive second contact that is contiguous with the first contact.

* * * * *

UNITED STATES PATENT AND TRADEMARK OFFICE
CERTIFICATE OF CORRECTION

PATENT NO. : 10,482,957 B2
APPLICATION NO. : 15/978003
DATED : November 19, 2019
INVENTOR(S) : Philippe Boivin et al.

It is certified that error appears in the above-identified patent and that said Letters Patent is hereby corrected as shown below:

In the Claims

Column 6, Line 40:
"the group comprising consisting of titanium and hafnium." should read, --the group consisting of titanium and hafnium.--.

Signed and Sealed this
Twenty-fourth Day of March, 2020

Andrei Iancu
*Director of the United States Patent and Trademark Office*